United States Patent [19]

Peterson

[11] 4,158,877

[45] Jun. 19, 1979

[54] CONNECTING AND SUPPORTING CLAMP FOR TWO ADJACENTLY SITUATED PRINTED CIRCUIT CARDS

[75] Inventor: Sven T. Peterson, Tyreso, Sweden

[73] Assignee: Telefonaktiebolaget L M Ericsson, Stockholm, Sweden

[21] Appl. No.: 856,046

[22] Filed: Nov. 30, 1977

[30] Foreign Application Priority Data

Dec. 21, 1976 [SE] Sweden .............................. 7614332

[51] Int. Cl.² ............................................. H02B 1/02
[52] U.S. Cl. .................................... 361/412; 361/421
[58] Field of Search ............... 361/412, 408, 399, 421; 339/17 LM, 176 MP, 17 L, 17 M, 17 LC; 361/421; 29/629; 174/138 G

[56] References Cited

U.S. PATENT DOCUMENTS

| 2,740,097 | 3/1956 | Edelman et al. | 361/412 |
| 3,324,353 | 6/1967 | Retzlaff et al. | 361/412 |
| 3,831,063 | 8/1974 | Keough | 361/399 |

FOREIGN PATENT DOCUMENTS 938327 10/1963 United Kingdom ............... 339/17 LM

OTHER PUBLICATIONS

Lee et al., "Spider Contact," IBM Tech. Discl. Bull., vol. 11, No. 7, Dec. 1968, p. 730.

Primary Examiner—David Smith, Jr.
Attorney, Agent, or Firm—Hane, Roberts, Spiecens & Cohen

[57] ABSTRACT

A clamp for support and electrical connection of two adjacently positioned printed circuit cards consists of a sheet of electric conducting material and a first and a second piece of insulating material. The sheet has a middle uniform portion and two tapered legs at its ends. The two pieces are formed by extrusion on each side of the middle portion of the sheet and the length of one piece along the middle portion is preferably equal to the distance between the cards. When connecting the cards, the legs are bent perpendicular to the middle portion and their ends are joined to the cards by soldering.

5 Claims, 6 Drawing Figures

CONNECTING AND SUPPORTING CLAMP FOR TWO ADJACENTLY SITUATED PRINTED CIRCUIT CARDS

The present invention relates to a clamp for use primarily when mounting printed circuit cards in a telephone instrument.

In modern telephone instruments of the push-button type, the tendency is to integrate the electronic units being included in order to make these common for several functions. Therefore, it is natural to gather the greatest possible number of components in one or several circuit cards. The problem when assembling several cards is then to connect the components on one card with the components on another card in a suitable manner. Unlike certain other electronic equipment, it is, for reason of space, inconvenient in a telephone instrument to use card racks with connection jacks to connect the cards; the problem how to connect the cards must be solved in another way. It is previously known to utilize the components as supports for the cards by soldering one or several of them on two cards (see for example the U.S. Pat. No. 3,139,560), the cards, at the same time as these will be electrically connected, also being supported by the component or the components. As regards a telephone instrument, which can be subject to shocks, for example by dropping the instrument or during transportation, this solution is not quite satisfactory.

SUMMARY OF THE INVENTION

The object of the present invention is to provide a connecting and supporting clamp for two adjacently situated circuit cards in a telephone instrument which is cheap in manufacture and which gives a reliable, space saving and rigid fastening of the cards. The clamp consists of a sheet of electric conducting material and a first and a second piece of insulating material. The sheet has a middle portion and two tapered legs at the ends. The two pieces are formed by extrusion on each side of the middle portion of the sheet and the length of one piece along the middle portion is preferably equal to the distance between the cards being supported. When connecting cards, the legs are bent perpendicular to the middle portion and their ends are joined to the cards by soldering.

BRIEF DESCRIPTION OF THE DRAWING

The invention will be closely described with reference to the accompanying drawings in which.

DETAILED DESCRIPTION OF THE INVENTION

Figure 1:
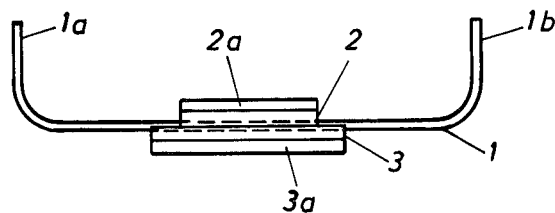
FIG. 1 shows a side view of the clamp according to the invention.
Figure 2:
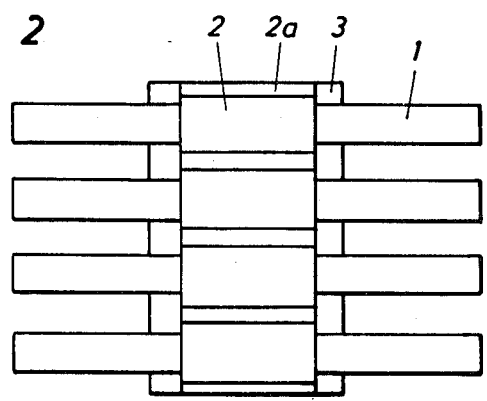
FIG. 2 shows in a top view a number of united clamps according to FIG. 1.
Figure 3:
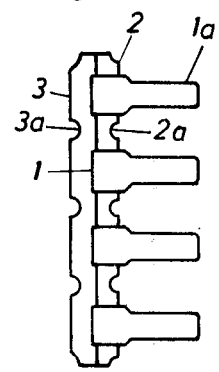
FIG. 3 shows the united clamps according to FIG. 2 seen from the side.

The clamp according to FIG. 1 consists of an electric connection part in the form of a sheet 1 of a metallic material, for example nickel-brass, which at both its ends is bent so that two legs 1a, 1b are formed. An insulating connection piece 2 and 3 is provided on mutual sides of the middle part of the sheet, the length of one piece 3 being chosen somewhat greater than the connection piece 2. In FIGS. 2 and 3 a set of clamps is shown after manufacturing, the clamps being joined by the connection pieces 2 and 3 by means of pressed grooves 2a, 3a. The legs 1a, 1b are preferably formed in such a way that their width is smaller than the width of the middle part of the sheet 1 and so that the width tapers towards the end.

Figure 4A:
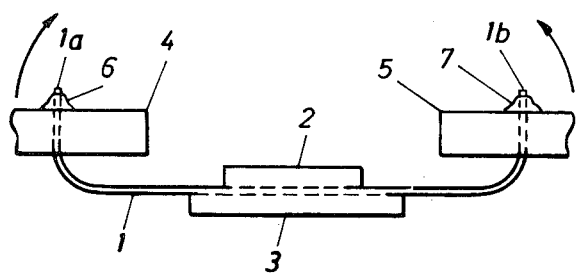
FIGS. 4a–b show the clamp according to the invention soldered in place on two circuit cards before and after bending, respectively.
Figure 4B:
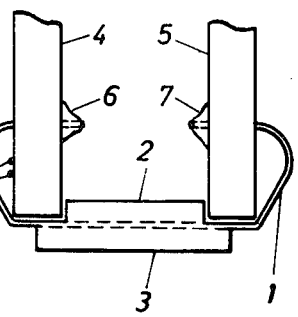

The connection of two circuit cards will be closer illustrated in FIGS. 4a–b. The two legs of a clamp are soldered so as to form a connection between two cards 4, 5 adjacently situated relatively each other. The soldering can be performed as power-operated soldering at the same time as the soldering of the other components on the card is carried out. The soldering points are designated 6 and 7. When the soldering has been carried out, the middle part of the sheet 1 is bent on mutual sides of the connection piece 3 and, at the same time, the cards 4, 5 are turned as is indicated with the shown arrows. In FIG. 4b the clamp and the circuit cards are shown in their finished position with the soldered sides of the cards turned toward each other. The cards will now be fastened by the soldered points 6, 7 as well as by means of the connection piece 2 serving as a distance member between the cards. The cards can also remain beside each other as it is shown in FIG. 4a and it is not necessary that they be situated in the same plane.

Figure 5:
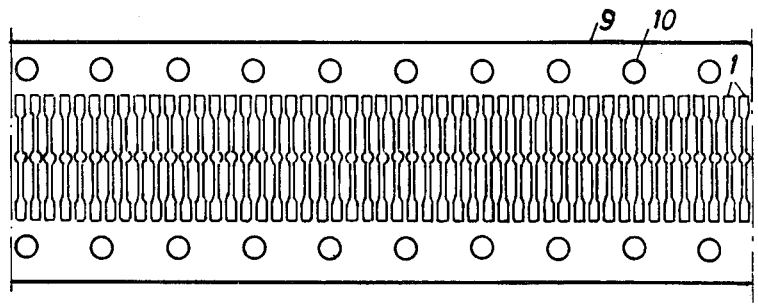
FIG. 5 shows the design of a band with stamped clamp elements in order to illustrate the manufacturing of the clamp according to the invention.

The manufacturing of the clamp is described with reference to FIG. 5. The clamp is stamped out from an endless sheet in such a manner that the legs hang together in both ends by means of carrying sheets 9 provided with steering holes 10. The material, for example nickel-brass, can be tin coated along both edges to give the best soldering capability when mounting the clamp. After the tin coating, the endless sheet is cut to suitable lengths. The cut lengths are thereafter placed in a moulding tool and a continuous plastic strand having a profile according to FIGS. 2 and 3 is extruded in the middle along the whole piece of sheet so that the legs are kept in place relative to each other. After that, the carrying sheets 9 are cut at the same time as the legs 1a, 1b are bent. Suitable clamp lengths are broken or cut, a set of clamps according to FIGS. 2, 3 being obtained. The breaking of the clamp set is then facilitated by the transverse grooves 2a, 3a.

The advantage of the clamp according to the invention is that the plastic details are formed in such a way that the clamp also functions as a distance member between the cards, which implies that an extra detail has been eliminated. The clamp, however, can also be utilized only as an electrical connection between two circuit cards, so that then it is not necessary that the actual distance between the cards be equal to the length of the distance member 2. A certain supporting action of the cards is obtained also in this case by spring action of the bent middle part 1 together with the soldering a respective card.

Another advantage of the clamp is that bending has been performed so that a "tunnel" outside the soldering points is obtained, whereby a printed conductor 8 (see FIG. 4b) can be placed between the card edge and the row of openings.

Further advantages are that the clamp is so cheap that some legs on one or several parts of the set according to FIG. 2 can be cut away in case the openings for the clamp are not situated close to each other. Furthermore, the clamp can be used and handled as a common component as no tools are needed for the mounting; but it is also suitable for automatic mounting if that is preferred.

Suitable lengths are broken either by hand (the set according to FIG. 2 is prepared by the grooves 2a, 3a) or by a tool.

The clamp according to the invention can also be used as a usual component on a circuit card for a connection only between points which connection has not been solved during the lay-out.

We claim:

1. An interconnecting and supporting clamp for two adjacently situated printed circuit cards, comprising: a rectangular plate of electrical conducting material having a middle portion; a first leg extending from one end of said rectangular plate at a substantially right angle thereto; a second leg extending from the other end of said rectangular plate at a substantially right angle thereto, said legs and said rectangular plate being of the same material and moulded from the same blank such that the transition from said plate to each of said legs is characterized by a smooth curve; a first connection piece of insulating material rigidly fastened on one side face of said middle portion; and a second connection piece of insulating material rigidly fastened on the other side face of said middle portion, the length of said second connection piece as taken in a direction from said first leg toward said second leg being greater than the length of said first connection piece such that said second connection piece extends beyond said first connection piece at both ends of said first connection piece whereby two adjacently situated printed circuit cards may be supported thereby.

2. The interconnecting and supporting clamp according to claim 1, wherein said first connection piece is mounted upon the top side face of said rectangular plate, which top side face faces in the direction in which said first and said second legs extend from said plate, said second connection piece being mounted on the bottom side face of said rectangular plate.

3. The interconnecting and supporting clamp according to claim 2, wherein the width of said rectangular plate is less than the width of either of said first and second connection pieces.

4. The interconnecting and supporting clamp according to claim 3, wherein each of said first and said second legs is tapered along its length in a direction from said rectangular plate toward the free ends of said legs.

5. The interconnecting and supporting clamp according to claim 4, further comprising a plurality of said clamps connected together in a side-by-side manner, the connection being a thin piece of said electrical conducting material joining the side edges of said first and second connection pieces such that a first groove is formed between adjacent side edges of respective first connection pieces and a second groove is formed between adjacent side edges of respective second connection pieces, whereby a clamp may be separated from the other clamps via said first and second grooves.

* * * * *